US012787875B2

(12) United States Patent
Kim et al.

(10) Patent No.: US 12,787,875 B2
(45) Date of Patent: Nov. 3, 2026

(54) SEMICONDUCTOR PACKAGE

(71) Applicant: SAMSUNG ELECTRONICS CO., LTD., Suwon-si (KR)

(72) Inventors: Dongkyu Kim, Suwon-si (KR); Kyung Don Mun, Suwon-si (KR); Kyoung Lim Suk, Suwon-si (KR); Hyeonjeong Hwang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 609 days.

(21) Appl. No.: 18/357,484

(22) Filed: Jul. 24, 2023

(65) Prior Publication Data

US 2024/0178185 A1 May 30, 2024

(30) Foreign Application Priority Data

Nov. 28, 2022 (KR) ........................ 10-2022-0161619

(51) Int. Cl.

| | |
|---|---|
| ***H10W 90/00*** | (2026.01) |
| ***H10B 80/00*** | (2023.01) |
| ***H10W 40/25*** | (2026.01) |
| ***H10W 70/60*** | (2026.01) |
| ***H10W 70/63*** | (2026.01) |
| ***H10W 70/685*** | (2026.01) |

(52) U.S. Cl.

CPC ............ *H10W 90/00* (2026.01); *H10B 80/00* (2023.02); *H10W 40/258* (2026.01); *H10W 70/611* (2026.01); *H10W 70/635* (2026.01); *H10W 70/685* (2026.01)

(58) Field of Classification Search

CPC ............... H10W 90/00; H10W 40/258; H10W 70/611; H10B 80/00

See application file for complete search history.

(56) References Cited

U.S. PATENT DOCUMENTS

| | | | | |
|---|---|---|---|---|
| 9,553,071 | B1 | 1/2017 | Haba | |
| 9,842,799 | B2 | 12/2017 | Jang | |
| 9,978,731 | B1 * | 5/2018 | Kim .................... | H10W 40/228 |
| 10,109,617 | B2 | 10/2018 | Lee et al. | |
| 11,244,885 | B2 * | 2/2022 | Kwon ................. | H10W 40/037 |
| 11,735,571 | B2 * | 8/2023 | Kwon ................. | H10W 70/611 257/668 |
| 2019/0348340 | A1 * | 11/2019 | Kwon .................. | H10W 40/22 |
| 2021/0257324 | A1 | 8/2021 | Park et al. | |

(Continued)

FOREIGN PATENT DOCUMENTS

| | | |
|---|---|---|
| CN | 112992888 | 6/2021 |
| CN | 114361153 | 4/2022 |

(Continued)

*Primary Examiner* — Thao P Le

(74) *Attorney, Agent, or Firm* — Morgan, Lewis & Bockius LLP

(57) ABSTRACT

Disclosed is a semiconductor package comprising a lower circuit part having a first region and a second region horizontally offset from each other and including a connection structure within the first region and a logic chip within the second region, a memory structure that overlaps the connection structure in a vertical direction, and a thermal radiation structure that overlaps the logic chip in the vertical direction. The logic chip and the memory structure are spaced apart in a horizontal direction parallel to a top surface of the logic chip.

20 Claims, 10 Drawing Sheets

(56) References Cited

U.S. PATENT DOCUMENTS

| | | | | |
|---|---|---|---|---|
| 2022/0020701 | A1* | 1/2022 | Ko | H10P 72/74 |
| 2022/0045010 | A1 | 2/2022 | Shin et al. | |
| 2022/0302002 | A1 | 9/2022 | Kim et al. | |
| 2023/0065378 | A1 | 3/2023 | Kim et al. | |
| 2023/0075833 | A1* | 3/2023 | Choi | H10W 20/20 |
| 2023/0105942 | A1* | 4/2023 | Hwang | H10W 40/00<br>257/668 |
| 2024/0128145 | A1* | 4/2024 | Lee | H10B 80/00 |

FOREIGN PATENT DOCUMENTS

| | | | |
|---|---|---|---|
| KR | 10-2016-0049616 | A | 5/2016 |
| KR | 10-2019-0032147 | A | 3/2019 |
| KR | 10-2019-0139491 | A | 12/2019 |
| KR | 10-2021-0096497 | A | 8/2021 |
| TW | 202310272 | | 3/2023 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0161619 filed on Nov. 28, 2022 in the Korean Intellectual Property Office, the disclosure of which is hereby incorporated by reference in its entirety.

TECHNICAL FIELD

This disclosure relates generally to semiconductor packages, and more particularly, to semiconductor packages including a thermal radiation member.

DISCUSSION OF RELATED ART

A semiconductor package may be provided to secure an integrated circuit (IC) chip for use in electronic products. Typically, a semiconductor package is configured such that a semiconductor chip is mounted on a printed circuit board (PCB) and bonding wires or bumps are used to electrically connect the semiconductor chip to the printed circuit board. With recent developments in the electronic industry, semiconductor packages are variously developed to reach the goal of compact size, light weight, and/or low manufacturing cost. In addition, many types of semiconductor packages have been developed in correspondence with the expansion of their application field such as high-capacity mass storage devices. In particular, thermal characteristics of the semiconductor package have been increasingly important due to increasing power consumption resulting from high speed and capacity.

SUMMARY

Some embodiments of the present inventive concepts provide a semiconductor package having improved thermal radiation.

According to some embodiments of the present inventive concepts, a semiconductor package may comprise: a lower circuit part having a first region and a second region horizontally offset from one another, the lower circuit part including a connection structure within the first region and a logic chip within the second region; a memory structure that overlaps the connection structure in a vertical direction; and a thermal radiation structure that overlaps the logic chip in the vertical direction. The logic chip and the memory structure may be spaced apart in a horizontal direction parallel to a top surface of the logic chip.

According to some embodiments of the present inventive concepts, a semiconductor package may comprise: a lower circuit part having a first region and a second region horizontally adjacent to the first region, the lower circuit part including a connection structure within the first region and a semiconductor chip within the second region; a memory structure on the first region and overlapping the connection structure in a vertical direction; and a thermal radiation structure on the second region of the lower circuit part and overlapping the semiconductor chip in the vertical direction. The connection structure and the thermal radiation structure may not overlap each other.

According to some embodiments of the present inventive concepts, a semiconductor package may comprise: a lower circuit part including a redistribution substrate, a connection structure, and a semiconductor chip, the connection structure and the semiconductor chip being electrically connected to the redistribution substrate; a memory structure that overlaps the connection structure in a vertical direction; and a thermal radiation structure that overlaps an entirety of the semiconductor chip in the vertical direction. A width of the thermal radiation structure may be greater than a width of the semiconductor chip in a horizontal direction.

DETAILED DESCRIPTION OF EMBODIMENTS

Some embodiments of the present inventive concepts will now be described in detail with reference to the accompanying drawings to aid in clearly explaining the present inventive concepts.

Herein, when a first structure is said to overlap a second structure, the overlapping may be a partial overlapping in some embodiments and a complete overlapping in other embodiments.

Herein, when a first structure is said to be "disposed on", or "on" a second structure, or the like, a surface of the first structure directly contacts a surface of the second structure in some embodiments, but in other embodiments, an intervening element(s) may be disposed between the first and second structures, where the intervening element(s) directly contacts each of the first and second structures.

Herein, "include" encompasses both a part and an entirety. For example, when a structure is said to include a first material, the structure may include a second material in some embodiments, but may be composed entirely of the first material in other embodiments.

Figure 1A:
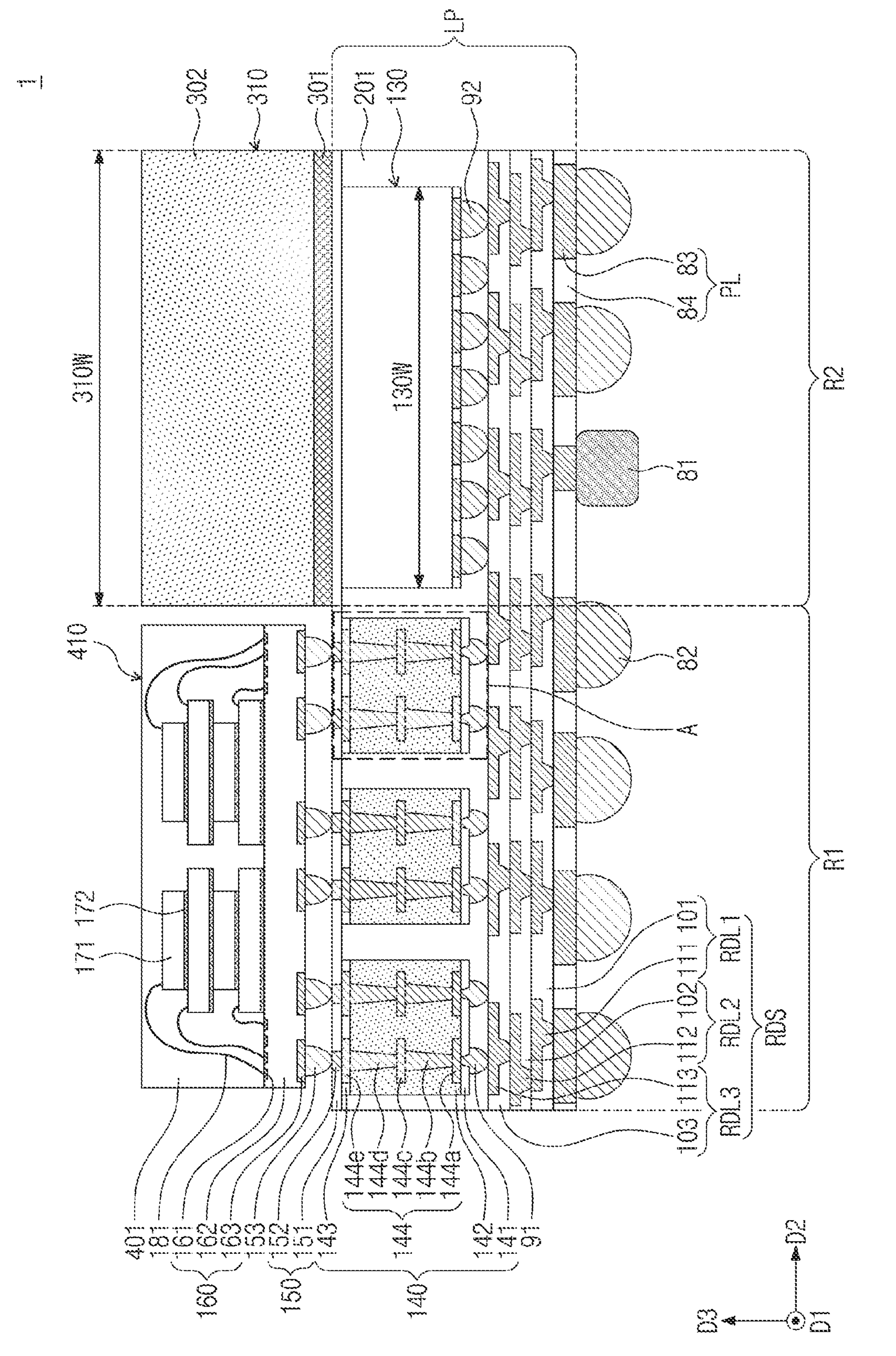
FIG. 1A illustrates a cross-sectional view showing a semiconductor package according to an embodiment of the present inventive concepts.
Figure 1B:
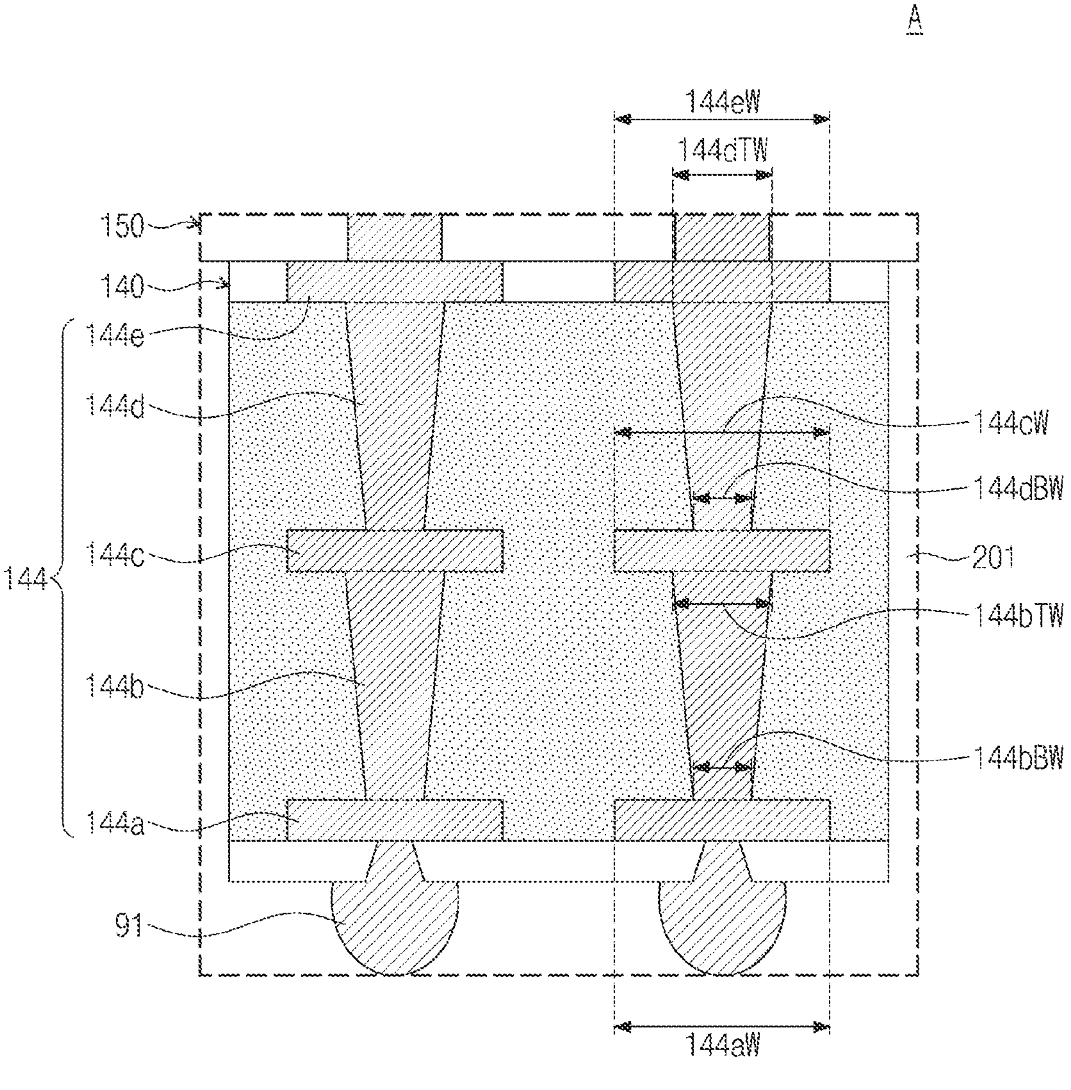
FIG. 1B illustrates an enlarged cross-sectional view showing section A of FIG. 1A.

FIG. 1A illustrates a cross-sectional view showing a semiconductor package according to an embodiment of the present inventive concepts. FIG. 1B illustrates an enlarged cross-sectional view showing section A of FIG. 1A.

Referring to FIGS. 1A and 1B, a semiconductor package 1 may include a lower circuit part (interchangeably, "lower part") LP forming a part of the overall circuitry of the semiconductor package 1; a memory structure 410; and a thermal radiation structure 310 on the lower part LP. The semiconductor package 1 may further include a passive element 81, an input/output (I/O) terminal ("external terminal") 82 for coupling to an external device (not shown), and "pad solder" (a solder interconnect) 153 electrically connecting a conductive pad of the memory structure 410 and a conductive pad of the lower part LP. The lower part LP may be a package itself, and may thereby be considered a sub-package of the semiconductor package 1.

The semiconductor package 1 includes at least one semiconductor component, which may include the memory structure 410 and/or a circuit component 130 within the lower circuit part LP. The circuit component 130 may be a semiconductor chip.

Aspects of the semiconductor package 1 may be described in the context of a three dimensional coordinate system with directions (axes) D1, D2 and D3 orthogonal to one another. Hereafter, for convenience of description, a horizontal direction may refer to any direction in a D1-D2 plane, and a vertical direction may be the D3 direction. Terms such as "above", "below", "lower" and "upper" may be used as relative terms referring to different levels in the vertical direction. However, the vertical dimension is not necessarily the thickness direction of the semiconductor package 1. In other words, the maximum vertical dimension is not necessarily smaller than the maximum horizontal dimension between external surface points of the semiconductor package 1.

The lower part LP may include a passivation/conductive layer PL (interchangeably, just "passivation layer") at a lowest portion thereof. The external terminal 82 may be disposed below (e.g., on a bottom surface of) the passivation layer PL. Plural external terminals 82 may be provided, in which case the external terminals 82 may be horizontally spaced apart from each other. Some examples of the external terminal 82 include solder, pillars, and bumps. The external terminal 82 may include a conductive metallic material. The external terminal 82 may include, for example, at least one selected from tin (Sn), lead (Pb), nickel (Ni), gold (Au), silver (Ag), copper (Cu), and aluminum (Al).

The passive element 81 may be disposed below the passivation layer PL. The passive element 81 may be disposed between a plurality of external terminals 82. Some examples of the passive element 81 may include a capacitor(s), a diode(s), a photodiode(s), and a resistor(s). The passive element 81 may be electrically connected to the circuit component 130 which may be a semiconductor chip such as a logic chip.

The passivation/conductive layer PL may include a passivation dielectric layer 84 and a conductive pad(s) 83. The passivation dielectric layer 84 may surround and protect each conductive pad 83. The passivation dielectric layer 84 may be formed of a dielectric material. The passivation dielectric layer 84 may be formed of, for example, resin. Each passivation pad 83 may be composed of or include a conductive material.

The lower part LP may be provided on the passivation layer PL. The lower part LP may include a first region R1 and a second region R2 horizontally offset from one another (e.g., adjacent to each other). The second region R2 of the lower part LP may be defined to indicate an area that is adjacent in a first direction D1 to the first region R1 of the lower part LP. The lower part LP may include a redistribution substrate RDS, a connection solder 91, a connection structure 140 on the connection solder 91, a chip solder 92, the circuit component 130 on the chip solder 92, a first molding layer 201, and a pad layer 150.

The redistribution substrate RDS may be disposed on the passivation layer PL. The redistribution substrate RDS may include a first redistribution layer RDL1, a second redistribution layer RDL2 on the first redistribution layer RDL1, and a third redistribution layer RDL3 on the second redistribution layer RDL2.

The first redistribution layer RDL1 may include a first redistribution pattern 111 and a first redistribution dielectric layer 101. The second redistribution layer RDL2 may include a second redistribution pattern 112 and a second redistribution dielectric layer 102. The third redistribution layer RDL3 may include a third redistribution pattern 113 and a third redistribution dielectric layer 103.

The first, second, and third redistribution patterns 111, 112, and 113 may include a conductive material. The external terminal 82, each conductive pad 83, and the first, second, and third redistribution patterns 111, 112, and 113 may be electrically connected to each other. The passive element 81, the conductive pad 83, and the first, second, and third redistribution patterns 111, 112, and 113 may be electrically connected to each other. Thereby, the redistribution substrate RDS may provide electrical connections, e.g., conductive traces in the horizontal direction (not shown in the figures) formed by the first to third redistribution patterns 111-113, that electrically connect the circuit component 130 to the memory structure 410. In other examples, the circuit component 130 is not electrically connected to the memory structure 410.

The connection solder 91 may be disposed on the first region R1 of the lower part LP. The connection solder 91 may be disposed between the redistribution substrate RDS and the connection structure 140. The connection solder 91 may be provided in plural. The connection solder 91 may be a conductive material.

The connection structure 140 may be disposed within the first region R1 of the lower part LP. The connection structure 140 may be provided in plural, and the connection structures 140 may be spaced apart from each other. The connection structure 140 may be disposed on the connection solder 91. The connection structure 140 may include a lower connection dielectric layer 141, a connection molding layer 142 on the lower connection dielectric layer 141, an upper connection dielectric layer 145 on the connection molding layer 142, and a through connector 144 that penetrates the upper connection dielectric layer 145 and the connection molding layer 142. In an embodiment, the connection structure 140 may be a PCB substrate.

The lower connection dielectric layer 141 may include a dielectric material. The lower connection dielectric layer 141 may include, for example, resin.

The connection molding layer 142 may be disposed on the lower connection dielectric layer 141. The connection molding layer 142 may include a dielectric material. The connection molding layer 142 may include a dielectric material. The connection molding layer 142 may cause a plurality of through connectors 144 to electrically separate from each other.

The through connector 144 may include a first connector 144*a*, a second connector 144*b* on the first connector 144*a*, a third connector 144*c* on the second connector 144*b*, a fourth connector 144*d* on the third connector 144*c*, and a fifth connector 144*e* on the fourth connector 144*d*. The first connector 144*a*, the second connector 144*b*, the third connector 144*c*, the fourth connector 144*d*, and the fifth connector 144*e* may be continuously connected to each other with no boundary therebetween, and the through connector 144 may have a single unitary structure. The connection molding layer 142 may surround the first connector 144*a*, the second connector 144*b*, the third connector 144*c*, and the fourth connector 144*d* of the through connector 144.

A width 144*a*W of the first connector 144*a* may be greater than a width 144*b*BW of a lower portion of the second connector 144*b*. A width 144*b*TW of an upper portion of the second connector 144*b* may be greater than the width 144*b*BW of the lower portion of the second connector 144*b*. A width of the second connector 144*b* may decrease in a direction from the upper to lower portions of the second connector 144*b*. The width 144*b*TW of the upper portion of the second connector 144*b* may be less than a width 144*c*W of the third connector 144*c*. A width 144*d*TW of an upper portion of the fourth connector 144*d* may be greater than a width 144*d*BW of a lower portion of the fourth connector 144*d*. A width of the fourth connector 144*d* may decrease in a direction from the upper to lower portions of the fourth connector 144*d*. The width 144*d*TW of the upper portion of the fourth connector 144*d* may be less than a width 144*e*W of the fifth connector 144*e*.

The first connector 144*a*, the second connector 144*b*, the third connector 144*c*, and the fourth connector 144*d* may penetrate the connection molding layer 142. The fifth connector 144*e* may penetrate the upper connection dielectric layer 145. Because the first connector 144*a*, the second connector 144*b*, the third connector 144*c*, and the fourth connector 144*d* penetrate the connection molding layer 142, the first to fourth connectors 144*a*, 144*b*, 144*c*, and 144*d* may be surrounded by the same dielectric material.

The chip solder 92 may be disposed within the second region R2 of the lower part LP. The chip solder 92 may be disposed between the redistribution substrate RDS and the circuit component 130. The chip solder 92 may be provided in plural. The chip solder 92 may be a conductive material.

The circuit component 130 may be disposed within the second region R2 of the lower part LP. The circuit component 130 may be disposed on the chip solder 92. The circuit component 130 may be electrically connected through the chip solder 92 to the redistribution substrate RDS. The circuit component 130 may be connected through the redistribution substrate RDS to the passive element 81. The circuit component 130 may be a semiconductor chip, e.g., a logic chip such as an application processor (AP), a microprocessor, a central processing unit (CPU), a controller, or an application specified integrated circuit (ASIC); or, an amplifier chip. A bottom surface of the connection structure 140 may be located at a lower vertical level than that of a bottom surface of the circuit component 130.

The lower molding layer 201 may be provided to surround the connection solder 91, the connection structure 140, the chip solder 92, and the circuit component 130. The lower molding layer 201 may be provided on the redistribution substrate RDS. The pad layer 150 may be provided on the lower molding layer 201, the connection structure 140, and the circuit component 130.

The pad layer 150 may include a lower dielectric layer 151 and a lower conductive pad 152. The lower dielectric layer 151 may include a dielectric material. The lower conductive pad 152 and the connection structure 140 may be electrically connected to each other.

The pad solder 153 may be provided on the pad layer 150. The pad solder 153 may be provided on the first region R1 of the lower part LP. The pad solder 153 may include a conductive material. The pad solder 153 may be electrically connected to the lower conductive pad 152 and the connection structure 140.

The memory structure 410 may be provided on the pad solder 153. The memory structure 410 may be provided on the first region R1 of the lower part LP. The memory structure 410 may be electrically connected through the pad solder 153 to the lower part LP. The memory structure 410 may include a package substrate 160, a bonding wire 181, semiconductor chips 171, semiconductor adhesion layers 172, and a memory molding layer 401. The memory structure 410 may be disposed on the first region R1 of the lower part LP.

The package substrate 160 may include a body 162, a lower package pad 163, and an upper package pad 161. The body 162 may include or be composed or, for example, silicon, glass, ceramic, or plastic. The package substrate 160 may include therein a single-layered or multi-layered wiring layer.

The semiconductor chips 171 may be mounted on the package substrate 160, and may be electrically connected through the bonding wire 181 to the package substrate 160. The semiconductor chips 171 may be stacked in a stepwise or zigzag structure. The semiconductor chip 171 may be a semiconductor memory chip.

The semiconductor adhesion layers 172 may be provided between the semiconductor chips 171 or between the semiconductor chip 171 and the package substrate 160. The semiconductor adhesion layer 172 may include an adhesive material.

The memory molding layer 401 may cover and protect the semiconductor chips 171. The memory molding layer 401 may cover the bonding wire 181 and a top surface of the package substrate 160. The memory molding layer 401 may be formed of, for example, a silicon-based material, a thermosetting material, a thermoplastic material, or an ultraviolet (UV) treated material.

The thermal radiation structure 310 may be provided on the lower part LP. The thermal radiation structure 310 may overlap an entirety of the circuit component 130 in the vertical direction. The thermal radiation structure 310 may include an adhesion layer 301 and a thermal radiation member 302 on the adhesion layer 301. The thermal radiation structure 310 may be disposed on the second region R2 of the lower part LP.

The adhesion layer 301 may be disposed on the pad layer 150, as illustrated in FIG. 1A. In other examples, a portion of the pad layer 150 directly above the circuit component 130 is omitted, and the adhesion layer 301 directly adheres the upper surface of the circuit component 130 to the lower surface of circuit component 130. The adhesion layer 301 may be disposed on the second region R2 of the lower part LP. The adhesion layer 301 may be formed of various adhesive materials capable of transferring heat from the circuit component 130 to the thermal radiation member 302 while rigidly adhering the thermal radiation member 302 on the pad layer 150. The adhesion layer 301 may be formed of, for example, a die attach film (DAF).

The thermal radiation member 302 of the thermal radiation structure 310 may be formed of a material whose thermal conductivity is greater than that of the circuit component 130. The thermal radiation member 302 may be formed of metal having good thermal conductivity. The thermal radiation member 302 may include, for example, copper.

In some embodiments, a width 310W of the thermal radiation structure 310 (shown as a width in the D2 direction) is greater than a width 130W of the circuit component 130. In other embodiments, the width 310W is equal to the width 130W. Moreover, the width of the thermal radiation structure 310 at any point in the vertical direction may equal or exceed the maximum width of the circuit component 130 in all directions of the horizontal (D1-D2) plane, and central points of the thermal radiation structure 310 and the circuit component 130 may be approximately aligned in the horizontal plane. Therefore, in the vertical direction, a lower surface of the thermal radiation structure 310 may overlap an entirety of a top surface of the circuit component 130. In a plan view from a distant point above the semiconductor package 1, no portion of the circuit component 130 may be visible beneath the thermal radiation structure 310. In this case, the thermal radiation structure 310 may be said to completely overlap the circuit component 130 in the vertical direction.

Because the thermal radiation structure 310 entirely overlaps the circuit component 130, the circuit component 130 may exhibit effective thermal radiation. It is noted here that in some embodiments, the width of the thermal radiation structure 310 in all directions of the horizontal plane may be uniform throughout its vertical extent. Likewise, the width of the circuit component 130 in all directions of the horizontal plane may be uniform throughout its vertical extent. For example, each of the thermal radiation structure 310 and the circuit component 130 has a rectangular profile in the horizontal plane (where a "rectangular profile" herein encompasses a square profile). In this case, when the rectangular profiles are uniform for all vertical levels, each of the thermal radiation structure 310 and the circuit component 130 may have a rectangular cuboid shape, and the horizontal profile of the thermal radiation structure 310 at any vertical level of the thermal radiation structure 310 may completely overlap the horizontal profile of the circuit component 130 at any vertical level of the circuit component 130.

The circuit component 130 and the memory structure 410 may not overlap each other in the vertical direction. The circuit component 130 and the memory structure 410 may be spaced apart from each other in the first direction D1 parallel to the top surface of the circuit component 130. The connection structure 140 and the thermal radiation structure 310 may not overlap each other in the vertical direction. The connection structure 140 and the thermal radiation structure 310 may be spaced apart from each other in the first direction D1 parallel to a top surface of the thermal radiation structure 310.

The thermal radiation member 302 may be disposed on a logic chip (e.g., the circuit component 130) of the lower part LP. Therefore, heat generated from the logic chip of the lower part LP may be effectively discharged through the thermal radiation member 302. Accordingly, the semiconductor package 1 may have improved thermal radiation and increased operating reliability.

According to the present inventive concepts, the connection structure 140 of the lower part LP may be connected to the memory structure 410. A plurality of connection structures 140 may be spaced apart in the lower part LP, and thus warpage risk may be reduced.

FIGS. 2A, 2B, 2C, 2D, 2E, and 2F illustrate cross-sectional views showing a method of fabricating a semiconductor package according to an embodiment of the present inventive concepts.

Figure 2A:
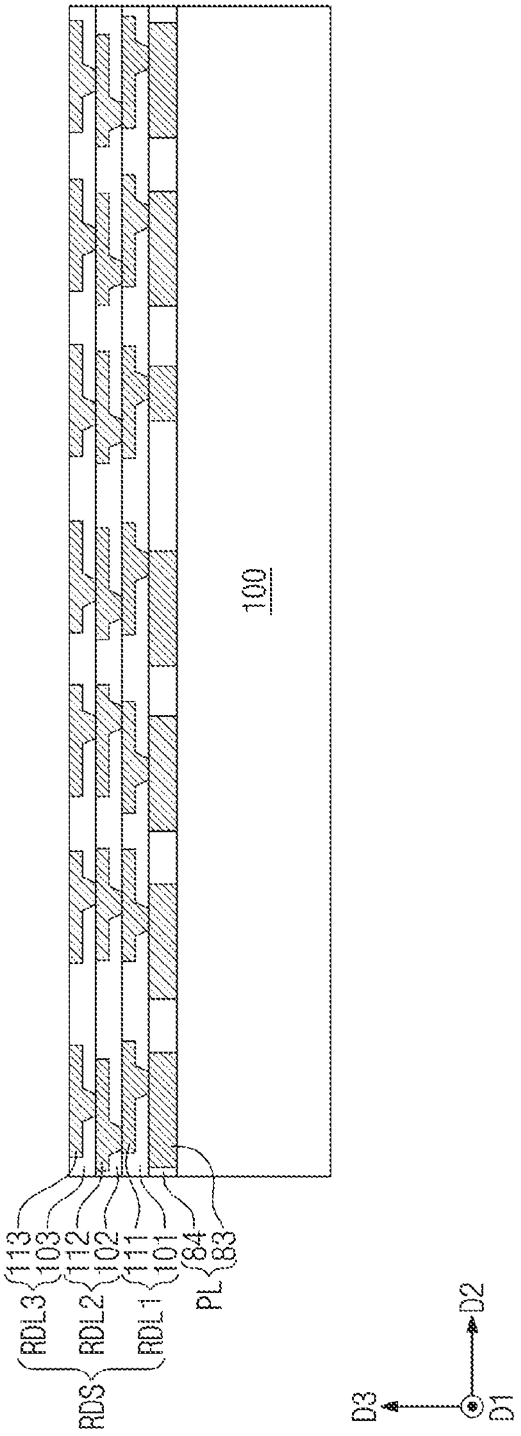
FIGS. 2A, 2B, 2C, 2D, 2E, and 2F illustrate cross-sectional views showing a method of fabricating a semiconductor package according to an embodiment of the present inventive concepts.

Referring to FIG. 2A, a passivation layer PL and a redistribution substrate RDS may be formed on a carrier substrate 100. A plurality of passivation pads 83 may be formed on the carrier substrate 100. The plurality of passivation pads 83 may be formed by, for example, an electroplating process. A passivation dielectric layer 84 may be formed on the carrier substrate 100 to protect the plurality of passivation pads 83. The passivation pads 83 and the passivation dielectric layer 84 may be formed to form the passivation layer PL.

The passivation layer PL may be provided thereon with the redistribution substrate RDS including a first redistribution layer RDL1, a second redistribution layer RDL2, and a third redistribution layer RDL3.

A first redistribution pattern 111 of the first redistribution layer RDL1, a second redistribution pattern 112 of the second redistribution layer RDL2, and a third redistribution pattern 113 of the third redistribution layer RDL3 may be formed to have an electrical connection with the passivation pad 83 of the passivation layer PL. The first, second, and third redistribution layers RDL1, RDL2, and RDL3 may be formed by an electroplating process, a patterning process, and a deposition process.

Figure 2B:
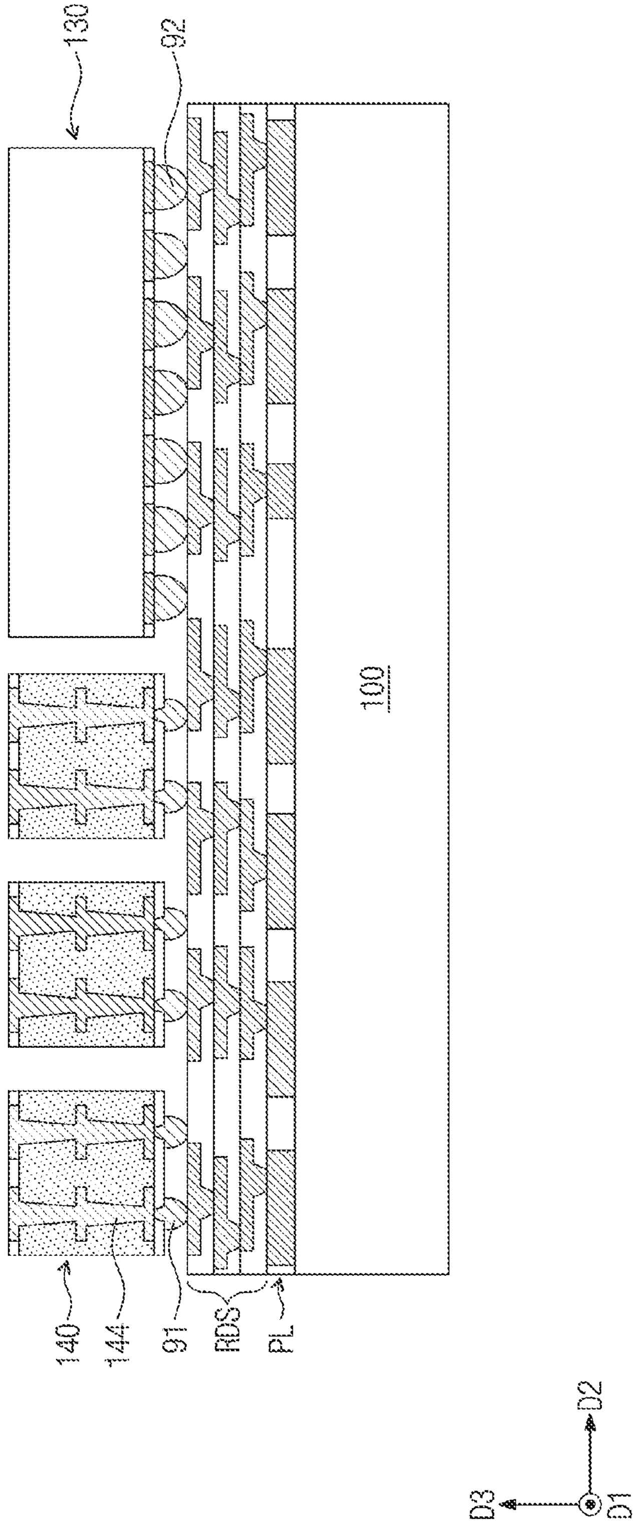

Referring to FIG. 2B, a connection structure 140 and a circuit component 130 may be mounted on the redistribution substrate RDS. A connection solder 91 may be formed between the redistribution substrate RDS and the connection structure 140. The redistribution substrate RDS and the connection structure 140 may be electrically connected to each other through the connection solder 91.

A plurality of connection structures 140 may be mounted. In this case, the plurality of connection structures 140 may be mounted adjacent to, but horizontally separated from, each other.

The circuit component 130 may be mounted on the redistribution substrate RDS. A chip solder 92 may be formed between the redistribution substrate RDS and the circuit component 130. The redistribution substrate RDS and the circuit component 130 may be electrically connected to each other through the chip solder 92.

Figure 2C:
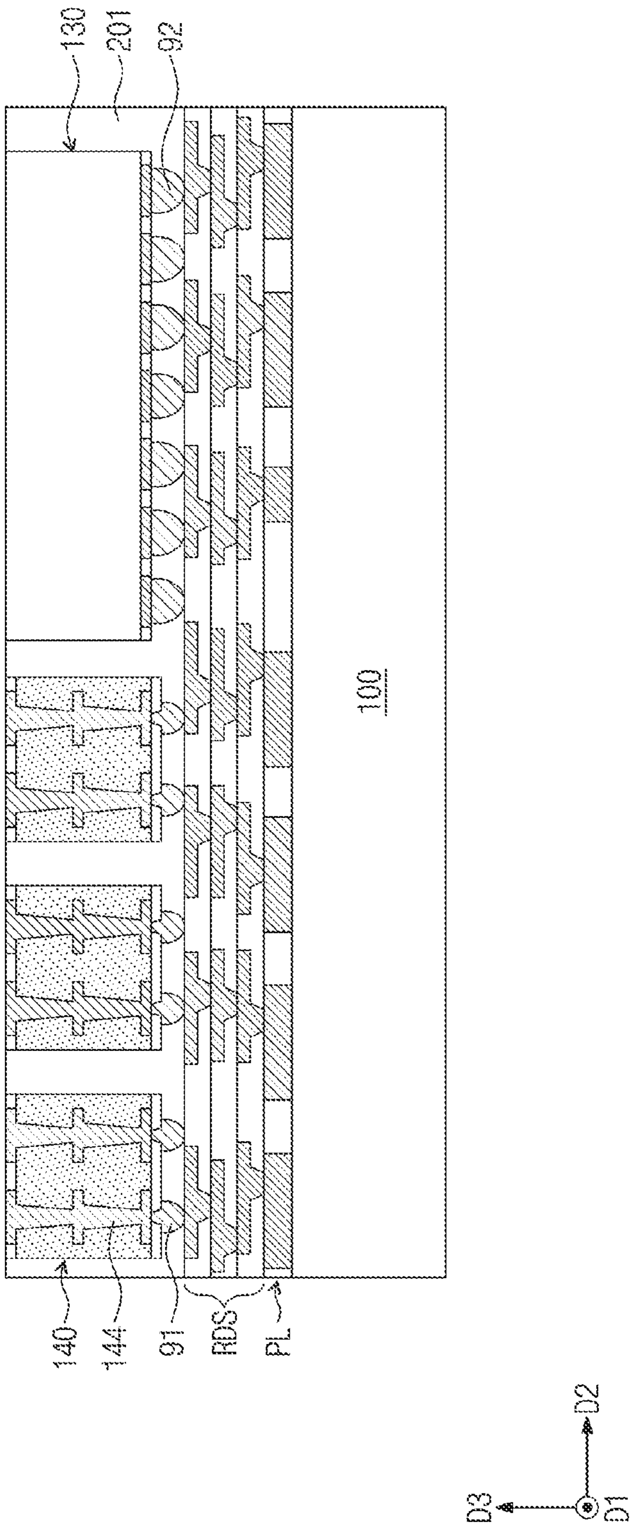

Referring to FIG. 2C, a lower molding layer 201 may be formed on the redistribution substrate RDS. The formation of the lower molding layer 201 may include forming the lower molding layer 201 to cover the connection structure 140 and the circuit component 130, and performing a grinding process to remove an upper portion of the lower molding layer 201 to expose a top surface of the connection structure 140 and a top surface of the circuit component 130. A top surface of the lower molding layer 201 may be located at the same level as that of the top surface of the connection structure 140 and that of the top surface of the circuit component 130.

Figure 2D:
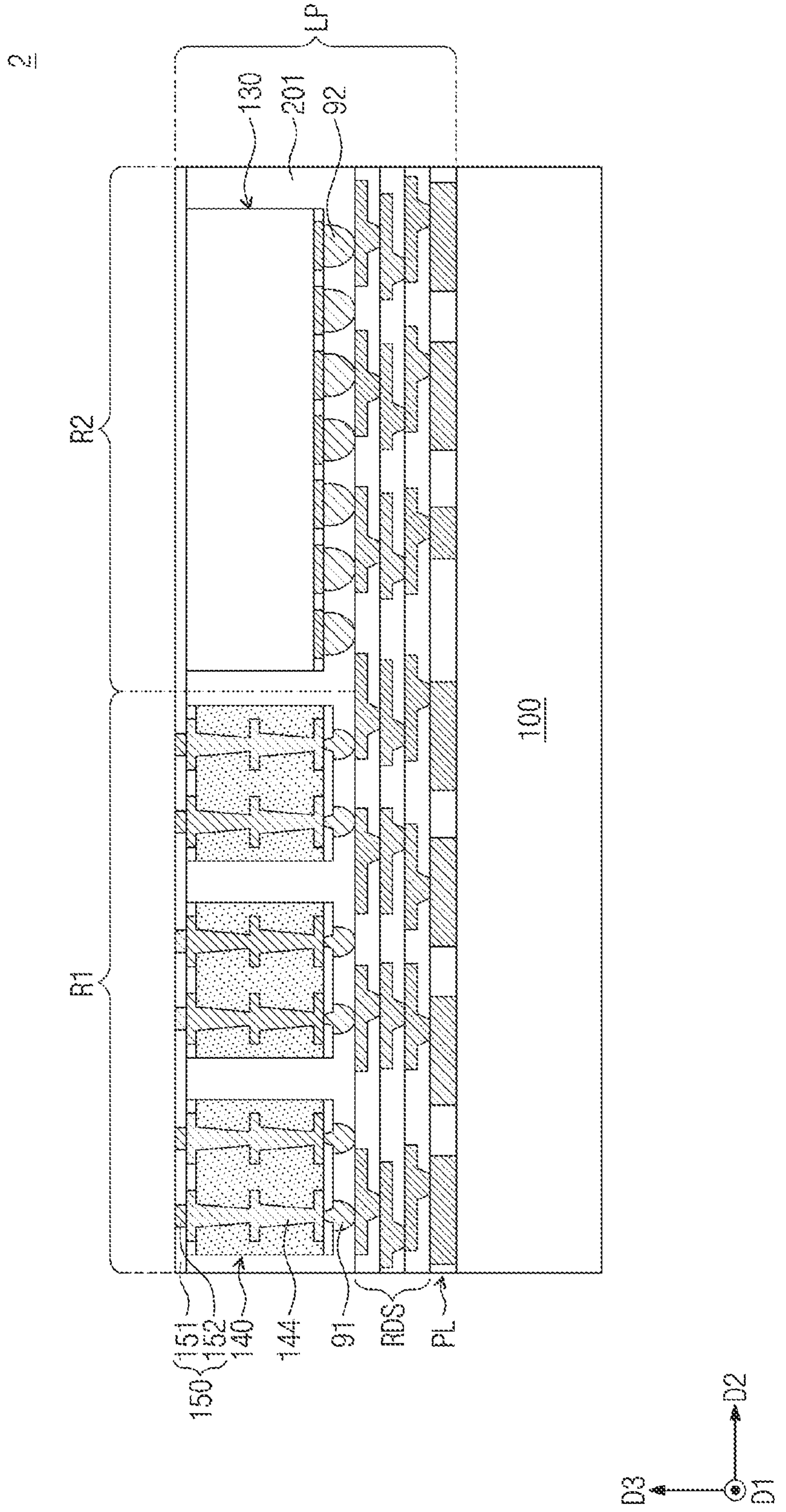

Referring to FIG. 2D, a pad layer 150 may be formed on the lower molding layer 201, the connection structure 140, and the circuit component 130. A plurality of lower conductive pads 152 may be formed on the connection structure 140. The plurality of lower conductive pads 152 may be formed by, for example, an electroplating process. The lower conductive pad 152 may be formed to have an electrical connection with a through connector 144 of the connection structure 140.

A lower dielectric layer 151 may be formed on the lower molding layer 201 to protect the plurality of conductive pads 152. The lower conductive pads 152 and the lower dielectric layer 151 may be formed to form the pad layer 150.

As the pad layer 150 is formed, a lower part LP may be formed to include the redistribution substrate RDS, the connection solder 91, the connection structure 140, the lower molding layer 201, the chip solder 92, the circuit component 130, and the pad layer 150.

The lower part LP may have a first region R1 at an area where the connection structure 140 is formed, and may also have a second region R2 at an area where the circuit component 130 is formed.

Figure 2E:
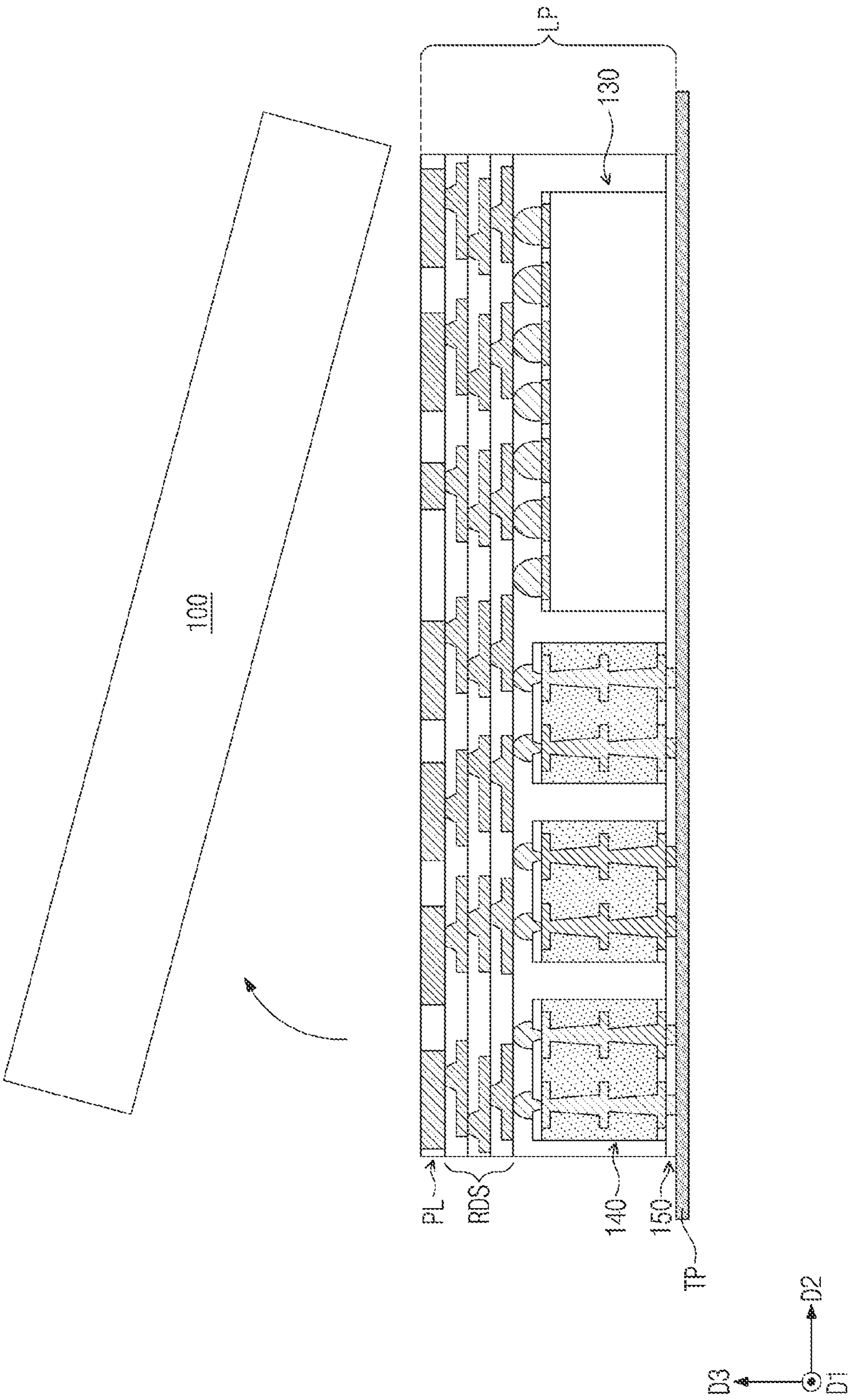

Referring to FIG. 2E, an intermediate formation body 2 may be turned over, which includes the carrier substrate 100, the passivation layer PL, and the lower part LP as shown in FIG. 2D. The reversed intermediate formation body 2 may be attached and fixed to a tape TP. The carrier substrate 100 of the intermediate formation body 2 may be removed in a state where the intermediate formation body 2 is fixed by the tape TP. Because the carrier substrate 100 is removed in a state where the tape TP is in contact with the pad layer 150, the carrier substrate 100 may be removed in a firmly fixed state. Accordingly, warpage may be prevented.

The tape TP may be removed after the carrier substrate 100 is removed. The tape TP may be removed after the tape TP is irradiated with an ultraviolet (UV) ray to reduce an adhesive force thereof.

In an alternative method, a holding fixture affixes the intermediate formation body 2 so that the use of the tape TP is unnecessary. Moreover, in some embodiments, the carrier substrate 100 is mechanically grinded off instead of being removed in one piece as illustrated in FIG. 2E.

Figure 2F:
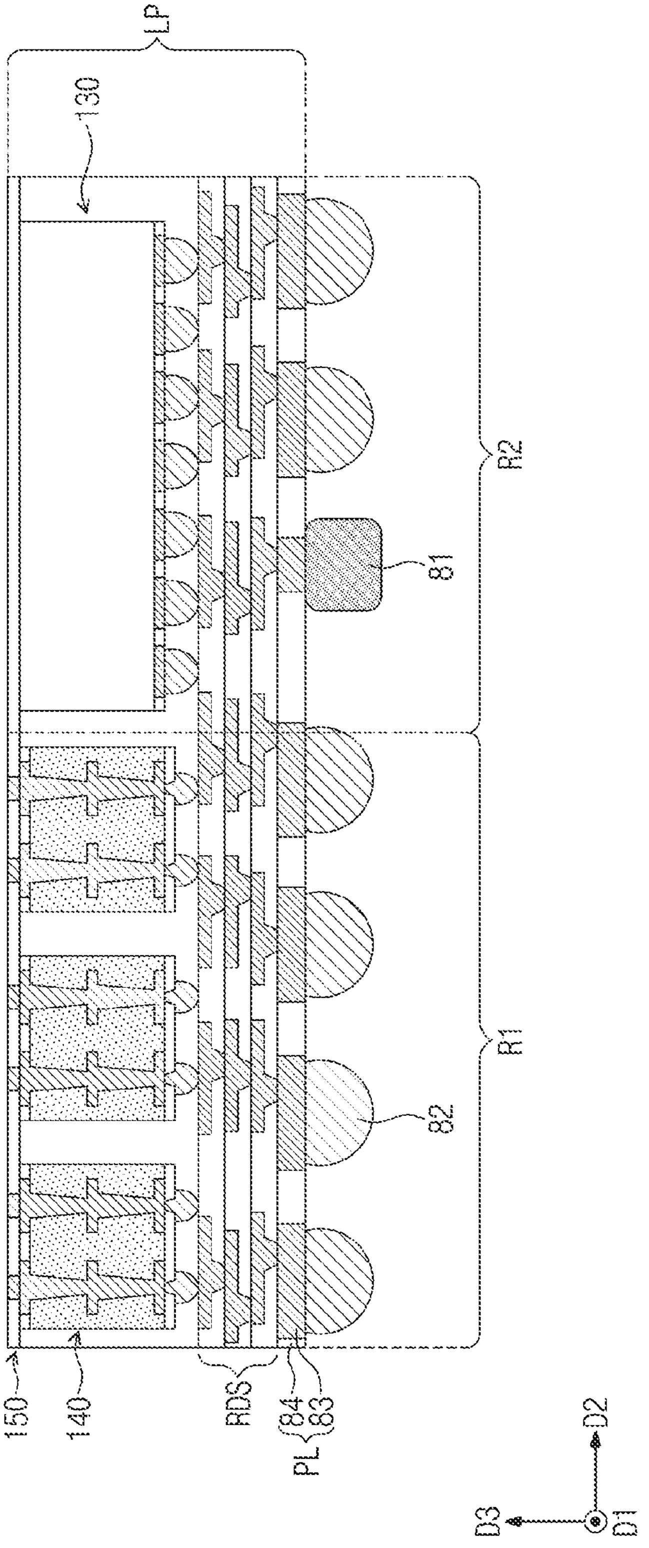

Referring to FIG. 2F, after the removal of the carrier substrate 100, an external terminal 82 and a passive element 81 may be formed on a bottom surface of the passivation layer PL. The external terminal 82 may be formed to have an electrical connection with the passivation pad 83 of the passivation layer PL. The passive element 81 may be formed to have an electrical connection with the passivation pad 83 of the passivation layer PL.

Referring to FIGS. 1A and 2F, after the formation of the external terminal 82 and the passive element 81, a memory structure 410 and a thermal radiation structure 310 (shown in FIG. 1A) may be formed on (or attached to) the pad layer 150. (Herein, "formed on" encompasses "attached to", unless the context indicates otherwise or an attachment of the subject component in a pre-fabricated state is not possible). Alternatively, the thermal radiation structure 310 is not formed on the pad layer 150 but is instead adhered directly to the circuit component 130 through adhesive 301. The memory structure 410 may be formed on the first region R1 of the lower part LP. The memory structure 410 may be connected to the pad layer 150 and a pad solder 153. The thermal radiation structure 310 may be formed on the second region R2 of the lower part LP. The thermal radiation structure 310 may be connected to the pad layer 150 through an adhesion layer 301 of the lower part LP.

Figure 3:
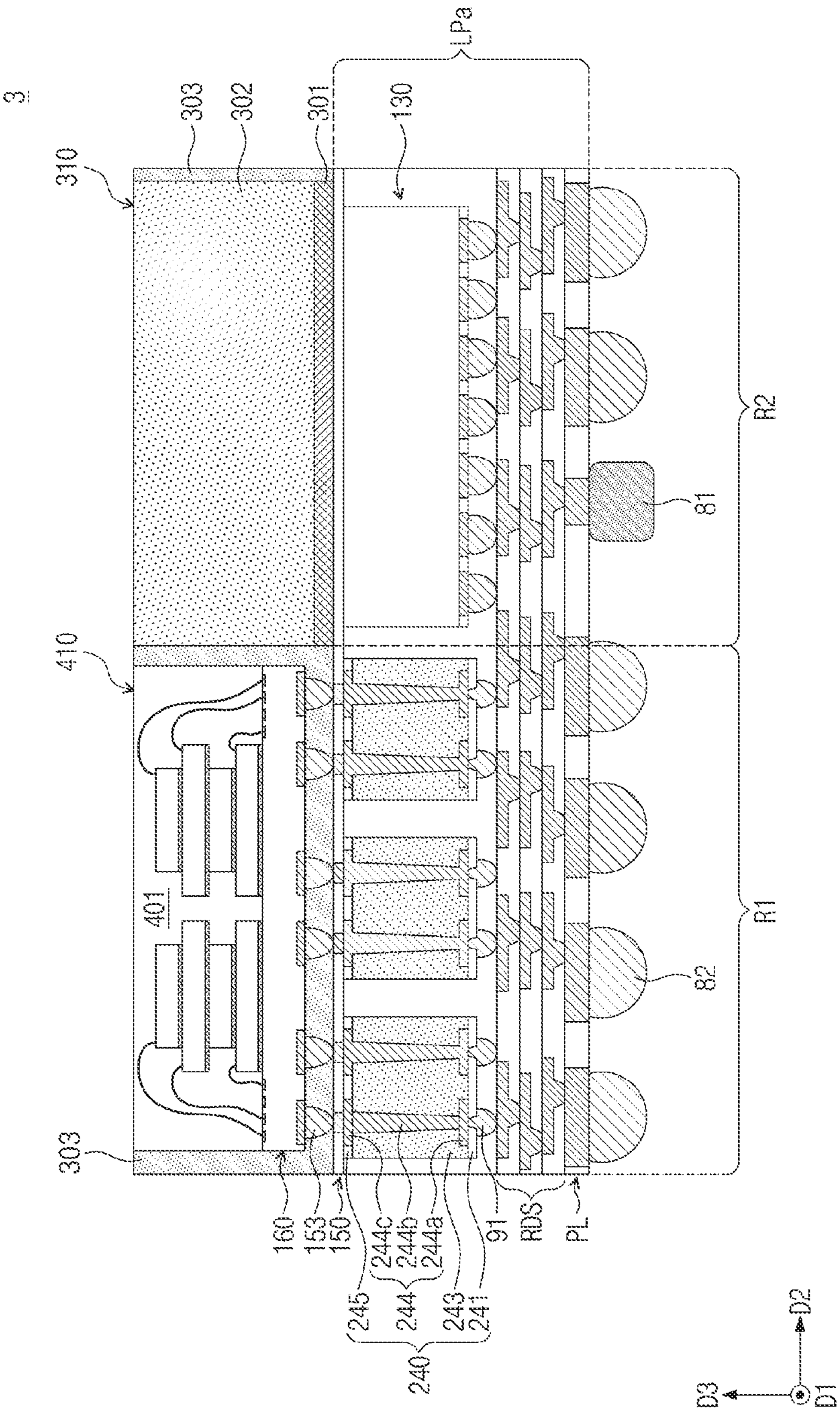
FIG. 3 illustrates a cross-sectional view showing a semiconductor package according to an embodiment of the present inventive concepts.

FIG. 3 illustrates a cross-sectional view showing a semiconductor package according to an embodiment of the present inventive concepts. Redundant description of some of the common elements of the semiconductor package 1 discussed above will be omitted below.

Referring to FIG. 3, a semiconductor package 3 may differ from the semiconductor package 1 described above primarily by including an upper molding layer 303 surrounding each of a memory structure 410 and a thermal radiation structure 310. Moreover, a lower part LPa may differ from the lower part LP described above by substituting slightly modified connection structures 240 for the connection structures 140 of FIG. 1A. Alternatively, the semiconductor package 3 utilizes the same connection structures 140 as in FIG. 1A.

In the example of FIG. 3, the semiconductor package 3 includes a passive element 81, an external terminal 82, a passivation layer PL, a redistribution substrate RDS, a lower part LP, a pad solder 153, a memory structure 410, a thermal radiation structure 310, and an upper molding layer 303.

The connection structure 240 may be disposed within the first region R1 of the lower part LP. The connection structure 240 may be provided in plural. The connection solder 91 may electrically connect conductive pads ("first connectors") 244*a* to the upper conductive pads of the redistribution substrate RDS, such that the connection structure 240 is disposed on the connection solder 91. The connection structure 240 may include a lower connection dielectric layer 241, a connection molding layer 243, an upper connection dielectric layer 245, and a through connector 244.

The through connector 244 may include first connectors 244*a*, a second connector (an elongated through via portion) 244*b* on each first connector 244*a*, and a third connector 244*c* on each second connector 244*b*. The first connector 244*a*, the second connector 244*b*, and the third connector 244*c* may be physically connected into a single unitary piece.

A width of the first connector 244*a* may be greater than that of a lower portion of the second connector 244*b*. A width of an upper portion of the second connector 244*b* may be greater than the width of the lower portion of the second connector 244*b*. A width of the second connector 244*b* may decrease in a direction from the upper to lower portions of the second connector 244*b*. The width of the upper portion of the second connector 244*b* may be less than a width of the third connector 244*c*.

The first connector 244*a* and the second connector 244*b* may penetrate the connection molding layer 243. The third connector 244*c* may penetrate the upper connection dielectric layer 245. As the first connector 244*a* and the second connector 244*b* penetrate the connection molding layer 243, the first connector 244*a* and the second connector 244*b* may be surrounded by the same dielectric material.

The upper molding layer 303 may be provided to protect the thermal radiation structure 310 and the memory structure 410 on the pad layer 150. The upper molding layer 303 may include a dielectric material.

Figure 4:
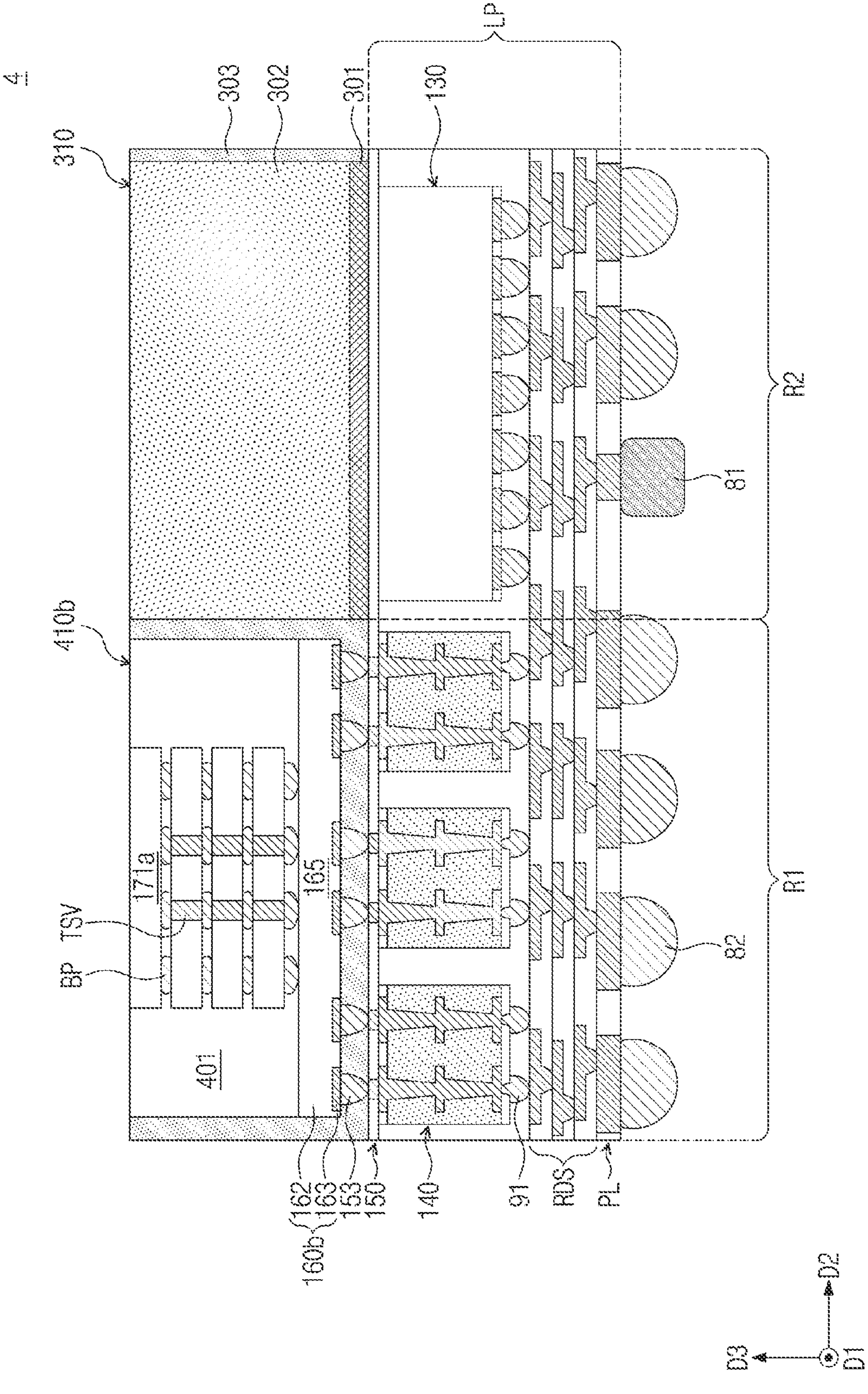
FIG. 4 illustrates a cross-sectional view showing a semiconductor package according to an embodiment of the present inventive concepts.

FIG. 4 illustrates a cross-sectional view showing a semiconductor package, 4, according to an embodiment of the present inventive concepts. Redundant description of common features described in the semiconductor packages above will be omitted below.

Referring to FIG. 4, a memory structure 410*b* may be disposed on the first region R1 of the lower part LP. The memory structure 410*b* may include a package substrate 160*b*, semiconductor chips 171*a*, semiconductor bumps BP, at least one "through via" TSV, and a memory molding layer 401.

The package substrate 160*b* may include a body 162 and a lower package pad 163. The package substrate 160*b* and the semiconductor chips 171*a* may be electrically connected through semiconductor bumps BP and the at least one through via TSV. Other aspects of the semiconductor package 4 may be the same as that described for the semiconductor package 1 of FIG. 1A.

According to the present inventive concepts, a thermal radiation member (e.g., 302) may be disposed on a chip structure of a lower part, which chip structure is a region from which a large amount of heat is emitted. Therefore, heat generated from the chip structure of the lower part may be effectively discharged through the thermal radiation member. Accordingly, the semiconductor package may have improved thermal radiation and increased operating reliability as compared to related art packages.

According to the present inventive concepts, a connection structure of the lower part may be connected to a memory chip. A plurality of connection structures (e.g., connection structures 144 or connection structures 244) may be disposed spaced apart in the lower part, and thus warpage risk may be reduced.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

The invention claimed is:

1. A semiconductor package, comprising:

a lower part having a first region and a second region adjacent to and horizontally offset from one another in a horizontal direction, the lower part including a connection structure within the first region and not extending into the second region in the horizontal direction and a logic chip within the second region;

a memory structure that overlaps the connection structure in a vertical direction; and a thermal radiation structure that overlaps the logic chip in the vertical direction, wherein the logic chip and the memory structure are spaced apart in the horizontal direction parallel to a top surface of the logic chip.

2. The semiconductor package of claim 1, wherein the lower part further includes a pad layer on the connection structure and the logic chip, the semiconductor package further comprises a pad solder between the pad layer and the memory structure, and the pad layer includes a conductive pad that electrically connects the connection structure and the pad solder to each other.

3. The semiconductor package of claim 2, wherein the thermal radiation structure further includes an adhesion layer and a thermal radiation member on the adhesion layer, the pad layer and the thermal radiation member are attached through the adhesion layer, and the adhesion layer overlaps the second region of the lower part in the vertical direction.

4. The semiconductor package of claim 1, wherein the connection structure includes a through connector, wherein the through connector includes:

a first connector;

a second connector on the first connector;

a third connector on the second connector;

a fourth connector on the third connector; and a fifth connector on the fourth connector.

5. The semiconductor package of claim 4, wherein a width of the third connector is greater than a width of an upper portion of the second connector, and a width of an upper portion of the fourth connector is less than a width of the fifth connector and greater than a width of a lower portion of the fourth connector.

6. The semiconductor package of claim 4, wherein a width of the second connector decreases in a direction from top to bottom portions of the second connector.

7. The semiconductor package of claim 1, wherein the thermal radiation structure includes or is composed of copper.

8. The semiconductor package of claim 1, wherein the thermal radiation structure completely overlaps the logic chip in the vertical direction, and a width of the thermal radiation structure is greater than a width of the logic chip in the horizontal direction.

9. The semiconductor package of claim 1, wherein the lower part further includes:

a redistribution substrate that includes a redistribution pattern; and a connection solder between the connection structure and the redistribution pattern of the redistribution substrate.

10. A semiconductor package, comprising:

a lower part having a first region and a second region horizontally adjacent to the first region, the lower part including a connection structure within the first region and not extending into the second region in a horizontal direction and a semiconductor chip within the second region;

a memory structure on the first region and overlapping the connection structure in a vertical direction; and a thermal radiation structure on the second region and overlapping the semiconductor chip in the vertical direction, wherein the connection structure and the thermal radiation structure do not overlap each other in the vertical direction.

11. The semiconductor package of claim 10, wherein the connection structure includes a through connector, wherein the through connector includes:

a first connector;

a second connector on the first connector; and a third connector on the second connector, wherein a width of an upper portion of the second connector is greater than a width of a lower portion of the second connector, wherein a width of the first connector is greater than the width of the lower portion of the second connector, and wherein the first connector and the second connector are surrounded by the same dielectric material.

12. The semiconductor package of claim 10, wherein the thermal radiation structure completely overlaps the semiconductor chip in the vertical direction, and a width of the thermal radiation structure is greater than a width of the semiconductor chip in a horizontal direction.

13. The semiconductor package of claim 10, wherein the lower part further includes a pad layer on the connection structure and the semiconductor chip, and the pad layer and the thermal radiation structure are attached to each other through an adhesion layer of the thermal radiation structure.

14. The semiconductor package of claim 10, wherein a thermal conductivity of the thermal radiation structure is greater than a thermal conductivity of the semiconductor chip.

15. The semiconductor package of claim 10, wherein the lower part further includes a redistribution substrate, and the semiconductor package further comprises a passive element electrically connected to the semiconductor chip.

16. The semiconductor package of claim 15, wherein the lower part further includes a connection solder between the redistribution substrate and the connection structure, and the redistribution substrate and the connection structure are electrically connected to each other through the connection solder.

17. The semiconductor package of claim 10, wherein the connection structure includes a PCB substrate.

18. The semiconductor package of claim 10, wherein the connection structure includes a plurality of connection structures that are spaced apart from each other, wherein each of the plurality of connection structures includes:

a lower connection dielectric layer;

a connection molding layer on the lower connection dielectric layer;

an upper connection dielectric layer on the connection molding layer; and a through connector that penetrates the upper connection dielectric layer and the connection molding layer.

19. The semiconductor package of claim 10, wherein the connection structure includes a lower connection dielectric layer, and a bottom surface of the lower connection dielectric layer is at a vertical level lower than a vertical level of a bottom surface of the semiconductor chip.

20. A semiconductor package, comprising:

a lower part including a redistribution substrate, a connection structure, and a semiconductor chip, the connection structure not extending into a region of the semiconductor chip in a horizontal direction, the connection structure and the semiconductor chip being electrically connected to the redistribution substrate;

a memory structure that overlaps the connection structure in a vertical direction; and a thermal radiation structure that overlaps an entirety of the semiconductor chip in the vertical direction, wherein a width of the thermal radiation structure is greater than a width of the semiconductor chip in a horizontal direction.

* * * * *